(12) United States Patent
Kendall et al.

(10) Patent No.: US 6,246,053 B1
(45) Date of Patent: Jun. 12, 2001

(54) NON-CONTACT AUTOFOCUS HEIGHT DETECTOR FOR LITHOGRAPHY SYSTEMS

(75) Inventors: Rodney Arthur Kendall, Ridgefield, CT (US); Gary J. Johnson, Wappingers Falls, NY (US); David J. Pinckney, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/273,785

(22) Filed: Mar. 22, 1999

(51) Int. Cl.$^7$ ................................................ H01J 27/304
(52) U.S. Cl. ..................... 250/252.1; 250/491.1; 250/492.2
(58) Field of Search ................ 250/252.1 R, 491.1, 250/492.2, 442.11

(56) References Cited

U.S. PATENT DOCUMENTS 4,885,472 * 12/1989 Young ........................... 250/252.1 R

* cited by examiner

*Primary Examiner*—Kiet T. Nguyen
(74) *Attorney, Agent, or Firm*—Eric W. Petraske

(57) ABSTRACT

In a particle beam lithography system, focus adjustment is controlled by a measurement of the gap between the workpiece being processed and a reference surface, such as the bottom surface of the focus lens, using a pair of capacitive sensors mounted on an arm that rotates to place one sensor on the beam axis to measure the workpiece height and the other displaced from the beam aperture to measure the height of the reference surface. The sum of the two readings is constant (for a given gap dimension), so that the accuracy of the measurement is not affected by the position of the arm within the gap.

7 Claims, 4 Drawing Sheets

NON-CONTACT AUTOFOCUS HEIGHT DETECTOR FOR LITHOGRAPHY SYSTEMS

FIELD OF THE INVENTION

The field of the invention is that of lithography, in particular the use of particle beams to write a pattern in a photoresist.

BACKGROUND OF THE INVENTION

Modern steppers for semiconductor lithography and micromachining have a depth of focus that is only a few microns. Since the vertical position of a wafer or other workpiece can easily move by more than that (because of irregularities in the wafer stage motion, irregularities in the wafer exposure surface such as bowing, and thermal expansion of the system components), it is known to measure the position of the wafer and, if necessary, change the wafer height or readjust the focus. Prior art systems have suffered from the limitation that the position sensors can not be allowed to block the beam, so that fixed position sensors must measure the height at a position considerably removed from the actual exposure location.

In the case of e-beam exposure systems, there are additional problems such as evaporation of the photoresist during exposure and subsequent contamination of the sensors and restrictions on the materials of the measurement system (non-magnetic and non-insulating) in order to avoid interference with the beam.

SUMMARY OF THE INVENTION

The invention relates to an apparatus for measuring the distance between the final lens (or other reference surface) in the optical train of a lithography system and the top surface of the wafer at the area being exposed, in which a support arm moves from a calibration position well away from the beam to a measurement position on the optical axis of the system.

An advantageous feature of the invention is the insensitivity of the measurement to mechanical construction and alignment differences between the calibration subsystem and the environment of the measurement.

Another advantageous feature of the invention is the ability to calibrate the sensors as often as desired in order to compensate for thermal and other changes.

Yet another advantageous feature of the invention is the ability to select sensors and other materials without regard to whether they would interfere with the beam.

Yet another advantageous feature of the invention is that the sensor is not subjected to contamination, which could affect performance, generated by exposure of photoresist by the electron beam.

DESCRIPTION OF THE PREFERRED EMBODIMENT

Figure 4:
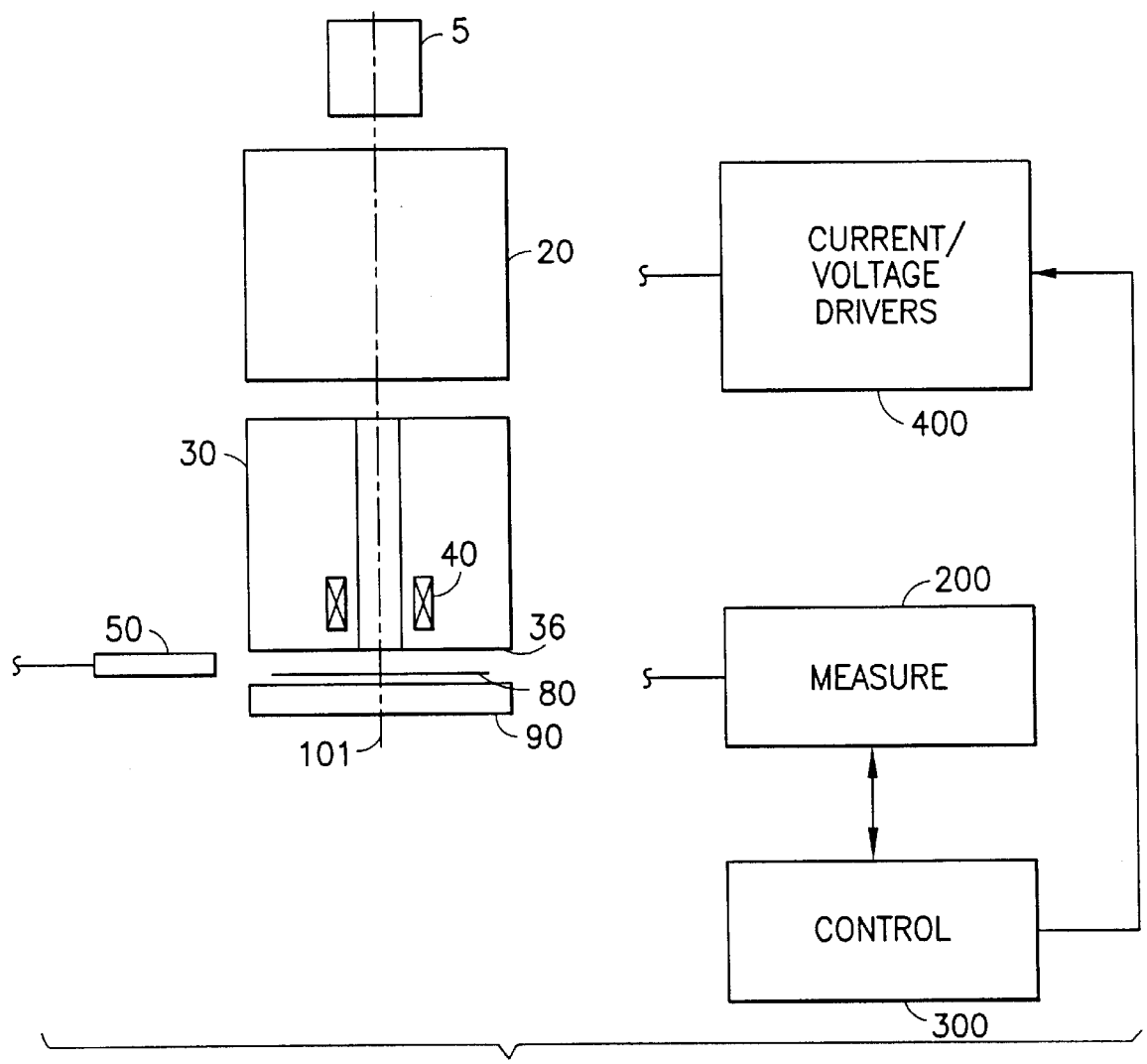
FIG. 4 shows a schematic drawing of a lithography system employing the invention.

Referring to FIG. 4, a partially pictorial, partially schematic drawing illustrates a generalized electron beam projection system employing the invention. At the top of the projection system, box 5 schematically represents an electron gun and accelerating voltage means for generating a beam of electrons and directing it along the system optic axis 101. The beam is manipulated by the lower portion of the system to write out on workpiece 80, illustratively a semiconductor wafer, a desired pattern. Workpiece 80 rests on stage 90, a conventional moving apparatus for moving the wafer under the beam. Box 20 illustrates schematically the upstream optics to manipulate the beam. The final lens in the optical system is illustrated as lens 30, having lens reference surface 36. Focus adjustment is conventionally provided by focus coil 40. The distance between lens reference surface 36 and the top of wafer 80 should be measured in a gap measurement system for the reasons given above in order to provide for proper adjustment of the beam focus. Box 50 denotes schematically the measurement apparatus to be described below. At the lower right of the figure, box 200 represents schematically conventional apparatus for measuring a gap using a capacitance probe and controller 300, which may be a general purpose computer, contains software for performing the calculations required in order to determine the gap height from the capacitance measurements and to calculate the required current change to be applied to a focus adjustment coil. Box 400 represents power supplies and driving circuits to apply the currents and voltages to the various system elements.

Illustratively, measurement system 200 puts out digital signals that represent the gap; controller 300 performs the required calculations, retrieving stored constants from its memory: and driver 400 receives a signal from controller 300 representing the new current required to put the beam in focus on the workpiece.

In general, an electron or other particle beam may be patterned in upstream subsystem 20 which may include a Gaussian "direct-write" system, subsystems to enable character projection, such as that illustrated in U.S. Pat. No. 4,213,053, cell projection, such as that illustrated in U.S. Pat. No. 5,784,150, shaped beam, such as that illustrated in U.S. Pat. No. 4,243,866 or subfield projection system such as that illustrated in U.S. Pat. No. 5,466,904. The measurement system may also be used in optical lithography systems or ion beam lithography systems.

The preferred embodiment for e-beam semiconductor lithography is the system illustrated in the '904 patent, which has very high throughput because a "subfield" of dimension about 1mm×1mm on the reticle is focussed on the wafer, thus providing a high degree of parallelism. Such a system employs a Variable-Axis Lens such as is described in U.S. Pat. No. 4,544,846 to achieve a large deflection range for the beam.

In any such e-beam system, there is only a small distance between the last lens and the wafer (i.e. a short focal length) and compensation for variations in the height of the top surface of wafer 80 is required for optimum accuracy.

Figure 1:
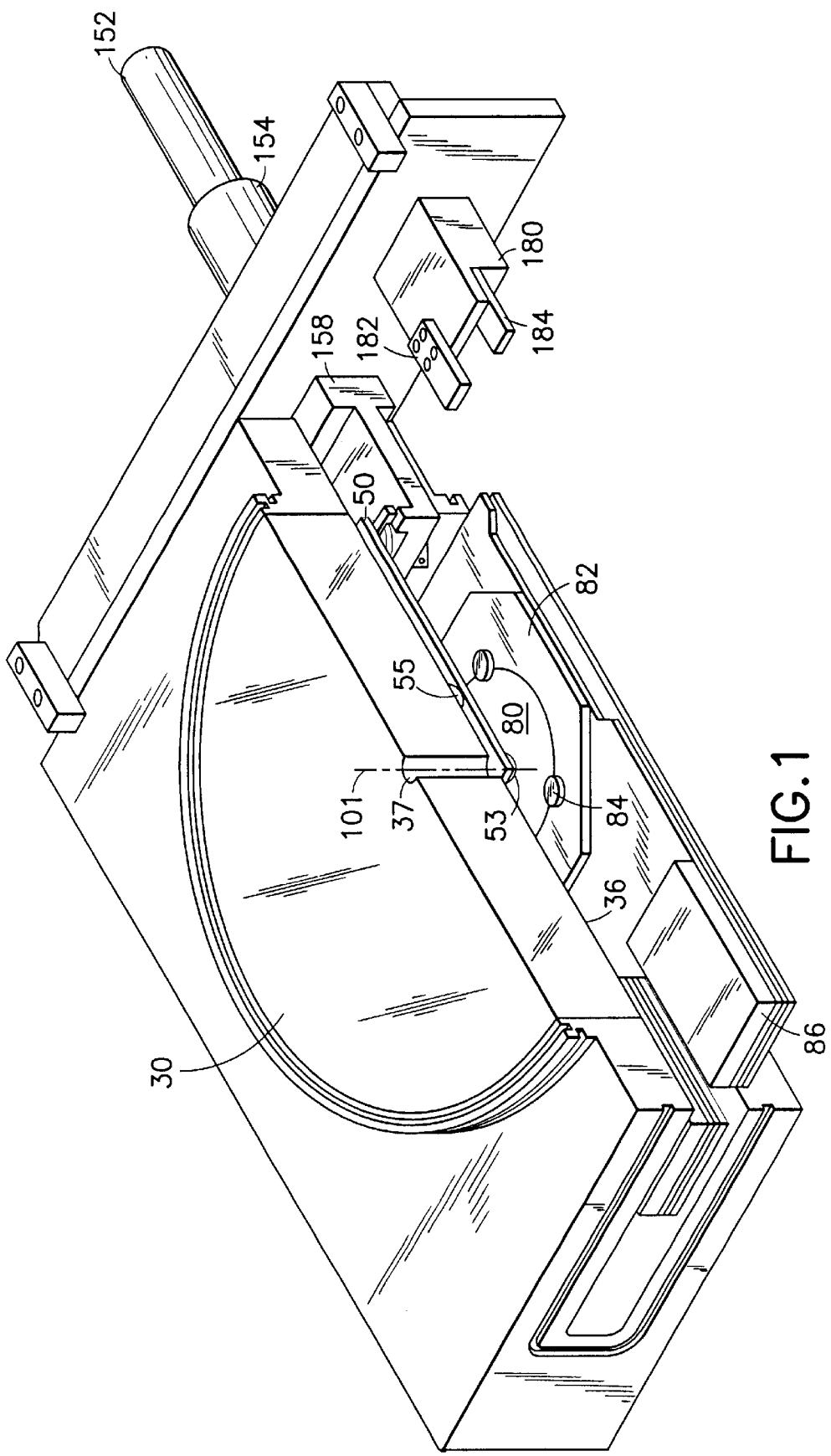
FIG. 1 shows a perspective view of a measurement system according to the invention with the support arm in the measurement position.

Referring now to FIG. 1, there is shown in perspective an apparatus suited for such lens to wafer measurements, in which the lens reference surface 36, having an aperture 37 to permit the passage of the beam, is the upper reference of the distance to be measured. The lower reference is the top of wafer 80. Support arm 50 is extended in the measurement position, with sensors 55 and 53 being, respectively, displaced from the aperture in order to measure the lens reference surface and being located on system axis 101 in order to provide the best reference for the wafer height. On the right of the figure, calibration unit 180 is positioned to provide the calibration measurements as required. A 90° rotation between the measurement position and the calibration position is convenient, but not essential. A system designer could also translate arm 50 along its axis, with unit 180 being located between surface 36 and the wall of the vacuum chamber. Translation of arm 50 parallel to its axis to a calibration position in the lower right of the figure could also be used.

Figure 2:
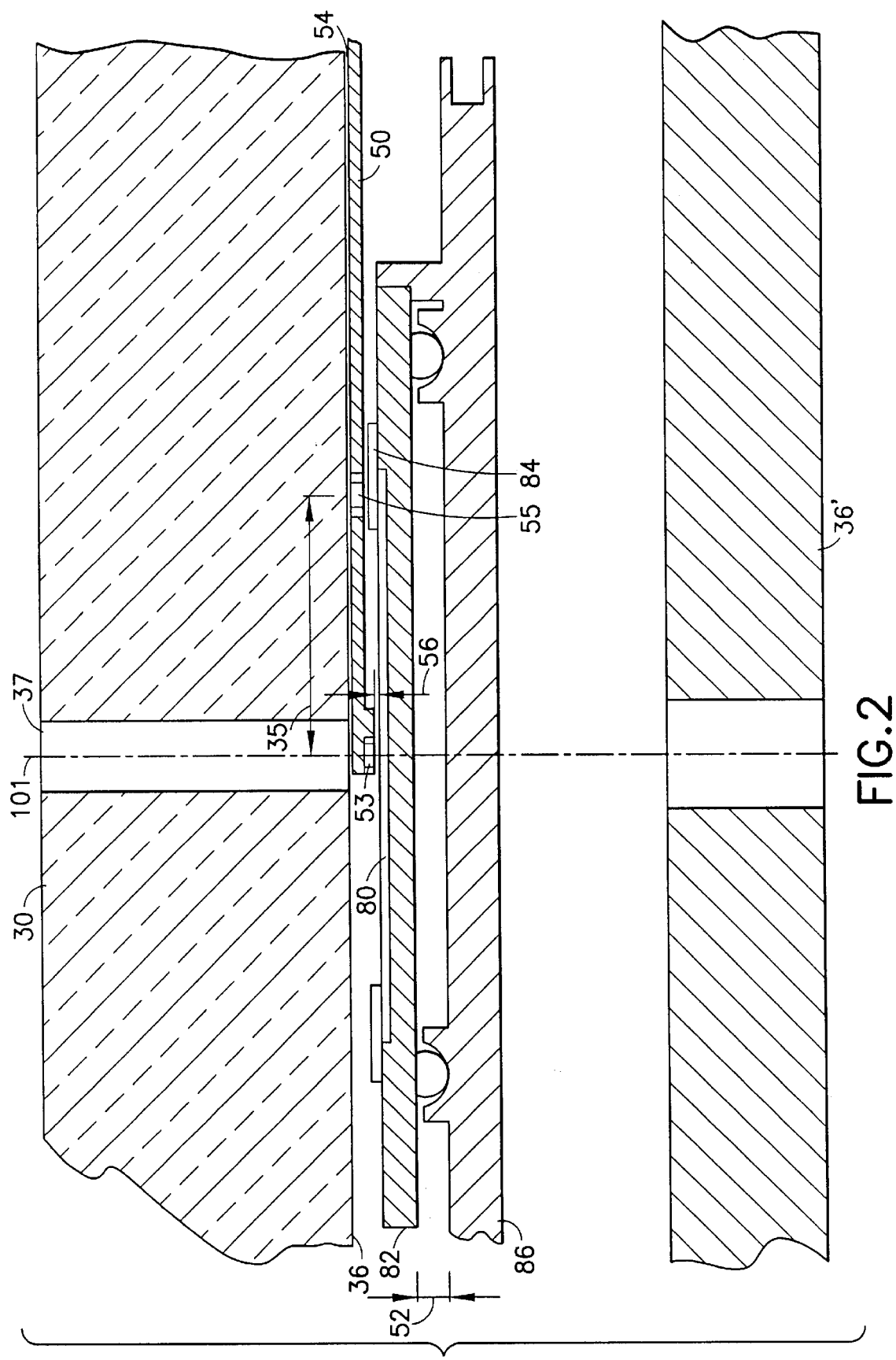
FIG. 2 shows a detail of the view in FIG. 1.

Referring now to FIG. 2, the area around the aperture is shown in more detail. System optic axis 101 passes through wafer sensor 53, centered in aperture 37. The total gap to be measured is indicated with a bracket 52 on the left of the Figure. That distance is the sum of reference gap 54, between the upper sensor 55 and lens reference surface 36, workpiece gap 56 between the lower sensor 53 and the wafer, and the thickness of support arm 50. Illustratively, gap 52 is about 5 mm and gaps 54 and 56 are about 1 mm each.

It can be seen that upper sensor 55 is displaced from the edge of aperture 37 by a distance denoted by bracket 35, illustratively about 43 mm. This allows for the use of backscatter diodes in that area to measure current scattered from wafer 80. Since the reference surface is fixed, the focal length of the lens is not a sensitive function of displacement of sensor 55 from axis 101. This current is conventionally used to determine wafer pattern topography. If these diodes are not used in any particular application, or if the area required is less than that shown, then the distance 35 can be correspondingly reduced. An optional lower lens reference 36' is shown on the bottom of the figure, for use in an embodiment in which it is preferred to immerse the wafer in the magnetic field of the final lens. As shown, the bulk of the gap 52 is filled by the thickness of arm 50. This thickness is a design choice. As illustrated, it permits the use of capacitance sensors designed to measure a small gap (nominally less than 1mm) with the required resolution of about ½ $\mu$m. Sensors 53 and 55 and associated electronics are conventional and well known in the art. Suitable capacitance sensors and associated electronics are available from Capacitec, Inc. of 87 Fitchburg Road, Ayer Mass., such as the HPB-75 probe and the 4100-CM3 system. The output of the system is a digital number that may be sent to controller 300 for use in calculating a corrected current to focus coil 40.

At the center of the Figure, conventional wafer stage paddle 86 transports wafer 80 and wafer holder 82 to move the area of interest under aperture 37. The drive system, associated feedback loops, etc. are conventional and well known to the art. For example, the optics will sweep the beam quickly over some deflection range and the stage will move relatively slowly to bring new areas of the wafer within the deflection range. The area of the workpiece under the deflection range will be referred to as the working portion of the workpiece.

Figure 3:
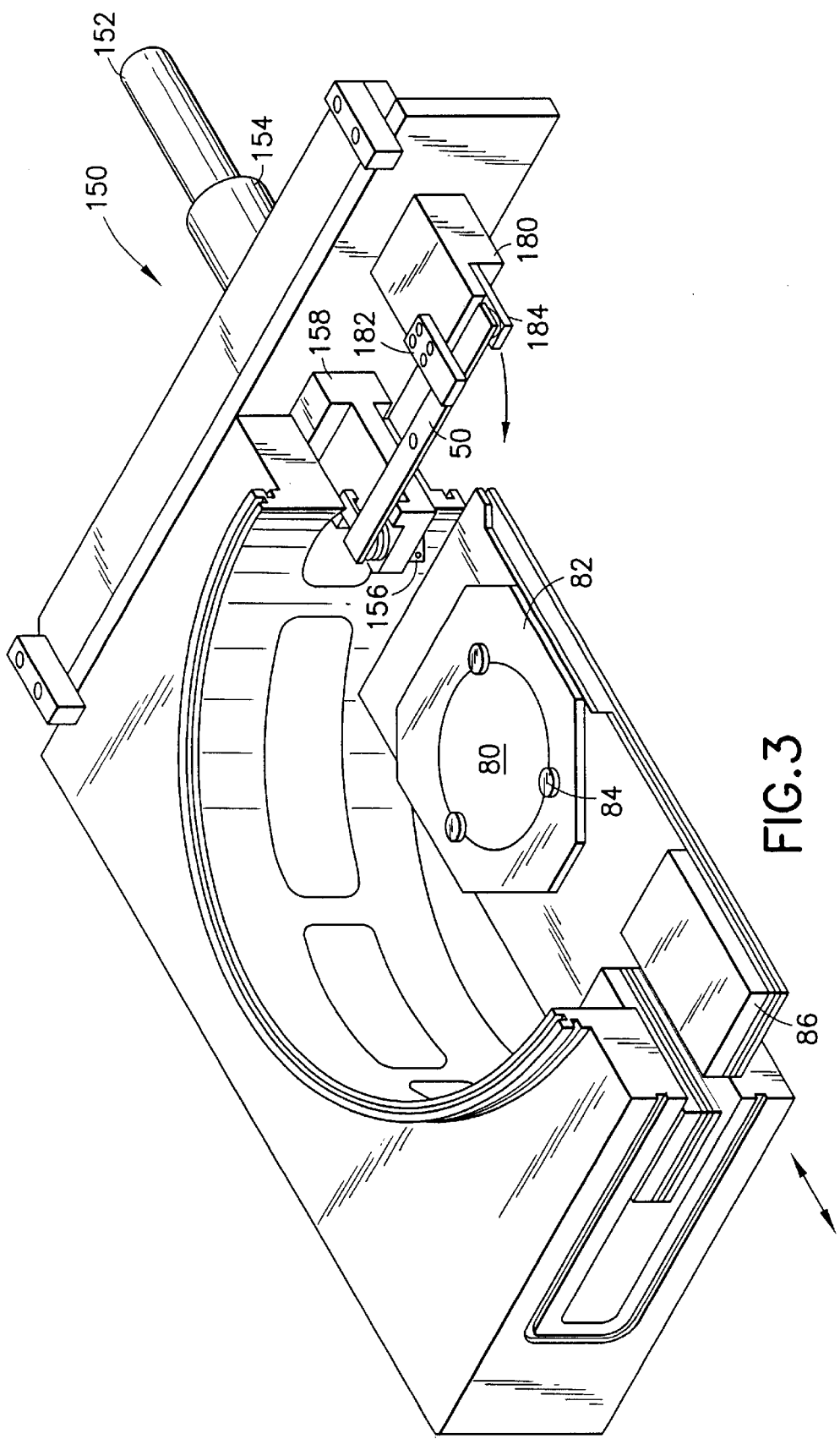
FIG. 3 shows a perspective view of the measurement system with the support arm retracted in the calibration position.

Referring now to FIG. 3, these is shown the system with lens 30 removed for clarity. Arm 50 is now in the calibration position, with the sensors 53 and 55 located opposite reference members 184 and 182, respectively. These reference members preferably have the same conductivity as the wafer and the lens reference surface, in order to provide the most accurate calibration, but that is not essential. In the initial system setup, the mechanical and electrical properties of calibration system 180 will be accurately compared with the corresponding properties of the lens reference surface and the wafer in order to provide accurate conversion of the reading during calibration to the reading in operation.

It is an advantageous feature of the invention that great mechanical accuracy is not required. It is not practical to machine and align the components so that the gaps in the measurement position are the same to the measurement accuracy of the system as the gaps in the calibration position. Those skilled in the art will appreciate in the light of this disclosure that such accuracy is not required. Even though the reference gap 54 and workpiece gap 52 will be different from a corresponding reference gap and workpiece gap in the calibration fixture, the sum of the gaps will be constant.

In a linear approximation, the sum of the two capacitance readings will be constant ($C_{Tot}=C_R+C_W$), where $C_{Tot}$ is the total capacitance, $C_R$ is the capacitance measured at the reference surface, and $C_W$ is the capacitance measured at the wafer), so that the measurement does not depend on whether arm 50 is at the same distance from member 182 as it is from lens reference surface 36. During setup, the constants that go into various functions will be established and stored with the beam correctly focused, i.e. $C_M=k_1C_R$, $D_{52}=f(k_1, C_M)$ and $\delta I=g(k_1, C_M)$, where $C_M$ is the measured sum of the upper and lower capacitances, $k_1$ is a constant and $C_R$ is the sum of the upper and lower capacitances in the reference fixture, derived from a workpiece calibration signal and a reference calibration signal. $D_{52}$, the corrected gap value signal, represents the value of gap 52, $\delta I$, the focus driver signal, represents the current change to be applied to focus coil 40 to bring the beam back into focus, and f and g are linear functions. The same apparatus and method can work if the various functions are not linear, with appropriate corrections to the algorithms.

In operation, the activation system, generally denoted by numeral 150 and comprising in this embodiment a pneumatic actuator 152 that moves linearly through a bellows vacuum feedthrough 154 to cause a slider-crank mechanism 156 to convert the linear motion to a 90° rotation, rotates support arm 50 into position. The measurement of the gap is made and arm 50 is retracted. The raw workpiece signal and the raw reference signal from sensors 53 and 55 will be summed (preferably in digital form, but possibly in analog form) to from a raw gap signal that reflects thermal and other changes in the system from the reference state during calibration. A correction using the stored constant $k_1$ will be made to calculate a focus driver signal that is fed to the driver circuit controlling coil 40.

Those skilled in the art will be aware that alternate mechanisms are available to move the support arm, such as an electric motor or a rotary pneumatic actuator outside the vacuum with a rotary vacuum feedthrough (e.g. a ferrofluidic feedthrough). Additionally, a voice coil mechanism, such as that used to control the read/write heads in disk drives, may be used.

While the invention has been described in terms of a single preferred embodiment, those skilled in the art will recognize that the invention can be practiced in various versions within the spirit and scope of the following claims.

We claim:

1. A gap measurement system for measuring a gap between a reference surface and a workpiece along a system axis direction and comprising:

a movable support arm carrying a workpiece sensor and a reference sensor on opposite sides thereof, positioning means for moving said support arm from a calibration position and for placing said support arm in a measurement position such that said workpiece sensor is adjacent an area of interest in a working portion of said workpiece and separated therefrom by a workpiece gap, whereby said working portion of said workpiece is blocked by said workpiece sensor, and such that said reference sensor is adjacent said reference surface and separated therefrom by a reference gap; and a calibration fixture disposed away from said working portion of said workpiece and adapted for receiving said support arm in said calibration position.

2. A gap measurement system according to claim 1, further including capacitive measurement means for measuring said workpiece gap and said reference gap while said support arm is in said measurement position and for measuring a corresponding workpiece gap and a corresponding reference gap while said support arm is in said calibration position.

3. A gap measurement system according to claim 2, in which said positioning means comprises rotating means for rotating said support arm between said calibration position and said measurement position.

4. A gap measurement system according to claim 2, further including controller means for converting a raw gap signal from said capacitive measurement means in said measurement position to a converted gap signal adjusted with reference to a reference gap signal from said capacitive measurement means in said calibration position.

5. A gap measurement system according to claim 1, in which said positioning means comprises rotating means for rotating said support arm between said calibration position and said measurement position.

6. A method of adjusting focus in a lithography system having beam generating means for generating an exposing beam, and beam focusing means for focusing said beam on a workpiece, said lithography system including a gap measurement system for measuring a gap between a reference surface and a workpiece along a system axis direction and comprising:

a movable support arm carrying a workpiece sensor and a reference sensor on opposite sides thereof, positioning means for moving said support arm from a calibration position and placing said support arm in a measurement position such that said workpiece sensor is adjacent an area of interest in a working portion of said workpiece, separated therefrom by a workpiece gap, whereby said working portion of said workpiece is blocked by said workpiece sensor, and such that said reference sensor is adjacent said reference surface, separated therefrom by a reference gap; and a calibration fixture disposed away from said working portion of said workpiece and adapted for receiving said support arm in said calibration position, comprising the steps of;

measuring a workpiece calibration signal and a reference calibration signal while said support arm is in said calibration position;

said support arm from said calibration position to said measurement position and measuring a raw workpiece signal and a raw reference signal while said support arm is in said measurement position;

correcting said raw workpiece signal and raw reference signal by means of correction parameters derived from said workpiece calibration signal and said reference calibration signal and calculating therefrom a corrected gap value signal;

deriving from said corrected gap value signal a focus driver signal; and transmitting said focus driver signal to said focus means, whereby said beam is focused on said workpiece.

7. A method according to claim 6, in which said raw workpiece signal, said raw reference signal, said workpiece calibration signal and said reference calibration signal are measured while said beam is correctly focused and parameters derived therefrom are stored; and said raw reference signal and said workpiece calibration signal are measured during system operation and processed with said stored parameters to derive said focus driver signal.

* * * * *